United States Patent
Lai et al.

(10) Patent No.: US 7,279,385 B2
(45) Date of Patent: Oct. 9, 2007

(54) FLASH MEMORY DEVICE AND MANUFACTURING METHOD THEREOF

(75) Inventors: Erh-Kun Lai, Hsinchu (TW); Hang-Ting Lue, Hsinchu (TW); Yen-Hao Shih, Hsinchu (TW); Chia-Hua Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 273 days.

(21) Appl. No.: 11/018,536

(22) Filed: Dec. 20, 2004

(65) Prior Publication Data

US 2006/0131635 A1  Jun. 22, 2006

(51) Int. Cl.
*H01L 21/336* (2006.01)

(52) U.S. Cl. ............... 438/260; 438/264; 438/266; 438/594; 257/E21.422

(58) Field of Classification Search ............ 438/260
See application file for complete search history.

(56) References Cited

U.S. PATENT DOCUMENTS

| | | | |
|---|---|---|---|
| 5,677,216 A * | 10/1997 | Tseng | 438/259 |
| 6,294,820 B1 * | 9/2001 | Lucas et al. | 257/412 |
| 6,380,068 B2 | 4/2002 | Jeng et al. | 438/626 |
| 6,501,123 B2 | 12/2002 | Liu | 257/315 |
| 6,559,009 B2 | 5/2003 | Jeng | 438/258 |
| 6,656,793 B2 | 12/2003 | Jeong et al. | 438/257 |
| 6,706,596 B2 | 3/2004 | Chang et al. | 438/260 |
| 6,710,396 B1 | 3/2004 | Wu | 257/315 |
| 6,724,036 B1 | 4/2004 | Hsieh et al. | 257/316 |
| 6,969,653 B2 * | 11/2005 | Jwa | 438/260 |

* cited by examiner

*Primary Examiner*—Stephen W. Smoot
(74) *Attorney, Agent, or Firm*—J.C. Patents

(57) ABSTRACT

A method of manufacturing a flash memory device is provided. Multiple stack structures each comprising a tunneling oxide layer and a first conductive layer are formed over a substrate. Thereafter, multiple embedded doping regions is formed in the substrate between the stack structures. A dielectric layer is formed over the substrate to cover the stack structures and then the dielectric layer is etched back and a portion of dielectric layer is remained on the stack structures. Using a portion of the remaining dielectric layer as a mask, a portion of the first conductive layer is removed. An inter-layer dielectric layer and a second conductive layer are sequentially formed over the first conductive layer. Because a self-aligned process is used to define the floating gate and the floating gate has a narrow-top/wide-bottom configuration, the fabrication process is simplified and the coupling ratio of the stack gate is increased.

33 Claims, 6 Drawing Sheets

FLASH MEMORY DEVICE AND MANUFACTURING METHOD THEREOF

BACKGROUND OF THE INVENTION

1. Field of the Invention

The present invention relates to a method of manufacturing memory. More particularly, the present invention relates to a flash memory device and manufacturing method thereof.

2. Description of the Related Art

Flash memory is a type of non-volatile memory that permits multiple data writing, reading and erasing operations. The stored data will be retained even power off. With all these advantages, flash memory has become one of the most widely adopted non-volatile memories for personal computer and electronic equipment.

FIG. 1 is a schematic cross-sectional view of a conventional flash memory device. As shown in FIG. 1, the flash memory mainly comprises a substrate 100, a tunneling oxide layer 102, a floating gate 104, an inter-polysilicon dielectric layer 106, a control gate 108 and a pair of source/drain regions 120. The floating gate 104 is disposed on the substrate 100. The floating gate 104 consists of a patterned conductive layer and spacers on each sidewall thereof. The tunneling oxide layer 102 is disposed between the substrate 100 and the floating gate 104. The control gate 108 is disposed over the floating gate 104 and the inter-polysilicon dielectric layer 106 is disposed between the control gate 108 and the floating gate 104. The tunneling oxide layer 102, the floating gate 104, the inter-polysilicon dielectric layer 106 and the control gate 108 together form the stack gate structure 110. Each source/drain region 120 is disposed in the substrate 100 on each side of the stack gate structure 110.

As the line width of semiconductor devices continue to decrease, the dimension of each device is also reduced. As a result, there is a significant drop in the coupling ratio between the control gate and the floating gate of the flash memory device.

In recent years, an improved method of manufacturing the flash memory has been developed. A first conductive pattern is formed over a substrate and then a second conductive pattern with a larger area is formed over the first conductive pattern. Since the first and the second conductive patterns can serve as the floating gate of the flash memory device, the coupling ratio between the floating gate and the control gate is increased.

Although the aforementioned technique of increasing the area of the floating gate can improve the coupling ratio between the floating gate and the control gate, the larger area occupied by the second conductive pattern set a limit on the ultimate level of integration for the devices. Moreover, the step of forming the second conductive pattern over the first conductive pattern increases the complexity of manufacturing the memory device. In other words, the process goes against our goal of miniaturizing devices and minimizing the number of fabrication steps.

SUMMARY OF THE INVENTION

Accordingly, at least one objective of the present invention is to provide a method of manufacturing a flash memory device that utilizes a self-aligned process to save one critical photolithographic step, thereby simplifying the fabrication process.

At least a second objective of the present invention is to provide a flash memory device having a top-narrow/bottom-wide floating gate so that the gate-coupling ratio can be increased and the device can be miniaturized.

To achieve these and other advantages and in accordance with the purpose of the invention, as embodied and broadly described herein, the invention provides a method of manufacturing a flash memory device. First, multiple stack structures each comprising a tunneling oxide layer and a first conductive layer are formed over a substrate. Thereafter, multiple embedded doping regions is formed in the substrate between the stack structures. A dielectric layer is formed over the substrate to cover the stack structures and then the dielectric layer is etched back and remaining a portion of the dielectric layer over the stack structures. Using a portion of the remaining dielectric layer over the stack structures as a mask, a portion of the first conductive layer is removed. Finally, an inter-layer dielectric layer and a second conductive layer are sequentially formed over the first conductive layer.

In the embodiment of the present invention, the step of forming the dielectric layer over the substrate comprises performing a high-density plasma chemical vapor deposition (HDPCVD) process. And, the step of forming the stack structures over the substrate further comprises forming a material layer over the first conductive layer, and the etching selectivity ratio of the material layer to the first conductive layer is larger than 1. Moreover, the step of forming the stack structures over the substrate comprises forming a tunneling oxide layer and a first conductive layer, forming a material layer over the first conductive layer and then forming a patterned photoresist layer over the material layer. Thereafter, using the patterned photoresist layer as an etching mask, the material layer, the first conductive layer and the tunneling oxide layer are removed. Finally, the patterned photoresist layer is removed. The first conductive layer comprises a doped polysilicon layer and the material layer comprises a nitride layer.

The present invention also provides a flash memory device. The flash memory device comprises a substrate, multiple dielectric layers on the substrate, multiple bit lines in the substrate under the dielectric layers, multiple word lines crossing over the bit lines above the substrate, a floating gate between the bit-line sandwiched substrate and the bit line, a tunneling dielectric layer between the substrate and the floating gate and an inter-layer dielectric layer between the floating gate and the word line. The floating gate comprises a top portion and a bottom portion such that the bottom of the bottom portion has an area larger than the top of the top portion.

In the present invention, a self-aligned process is deployed to define the floating gate so that one critical photolithographic processing step is saved. Furthermore, the floating gate structure has a top-narrow/bottom-wide configuration. Hence, the overlapping area between the floating gate and a subsequently formed control gate is increased. Aside from simplifying the fabrication process and increasing the gate-coupling ratio of the stack gate, the flash memory device is further miniaturized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
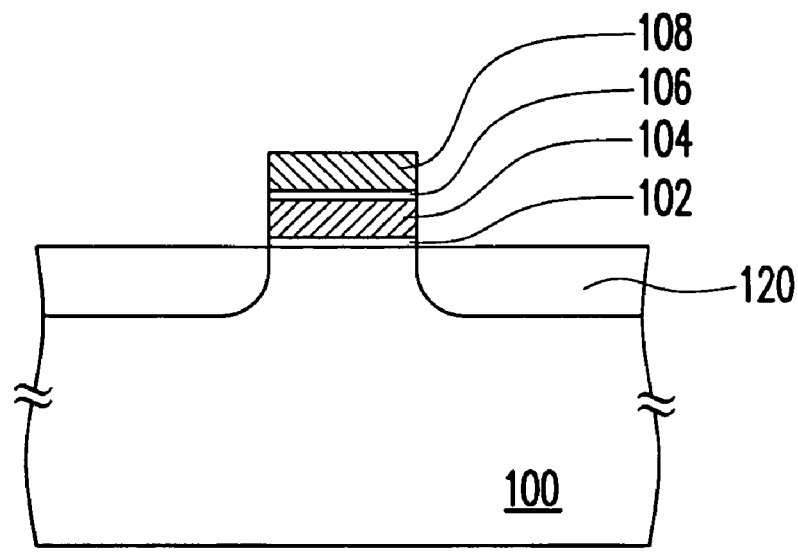
FIG. 1 is a schematic cross-sectional view of a conventional flash memory device.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
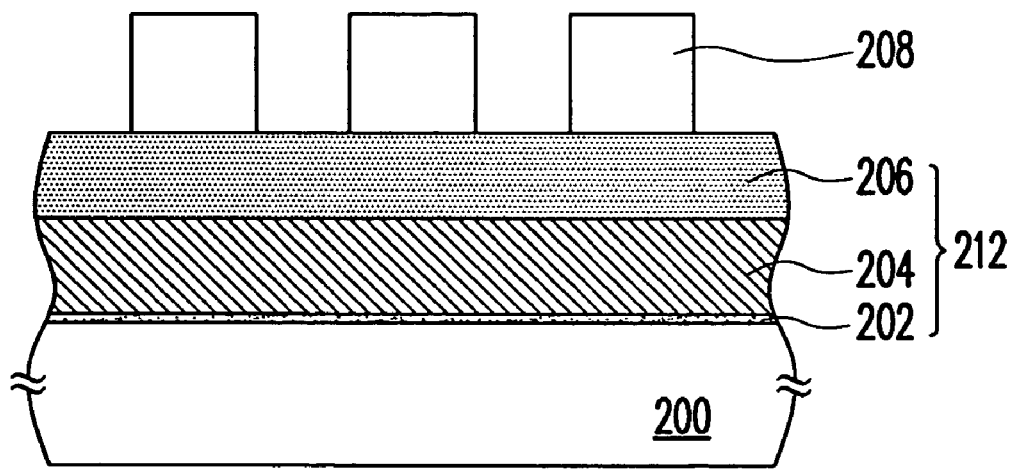
FIGS. 2A through 2H are schematic cross-sectional views showing the progression of steps for forming a flash memory device according to a first preferred embodiment of the present invention.
Figure 2B:
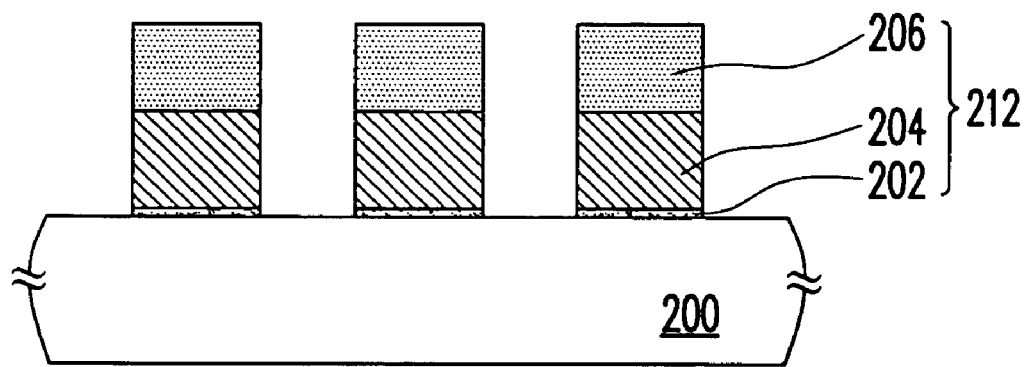

FIGS. 2A through 2H are schematic cross-sectional views showing the progression of steps for forming a flash memory device according to a first preferred embodiment of the present invention. As shown in FIGS. 2A and 2B, multiple stack structures 212 are first formed over a substrate 200. The steps of forming the stack structures 212, for example, include forming a tunneling oxide layer 202 over a substrate 200 first and forming a first conductive layer 204 over the tunneling oxide layer 202. The first conductive layer 204 is a doped polysilicon layer, for example. A material layer 206 is optionally formed over the first conductive layer 204, and the etching selectivity ratio of the material layer 206 to the first conductive layer 204 is larger than 1. Thereafter, a patterned photoresist layer 208 is formed over the material layer 206 for defining the areas to be removed and exposing a portion of the material layer 206. Further, the material layer 206 comprises a nitride layer, for example.

As shown in FIG. 2B again, the exposed material layer 206, the first conductive layer 204 and the tunneling oxide layer 202 are removed to expose the substrate 200 using the patterned photoresist layer 208 as a mask. The remaining material layer 206, the first conductive layer 204 and the tunneling oxide layer 202 together form multiple stack structures 212. Thereafter, the patterned photoresist layer 208 is removed. The material layer 206 in the foregoing steps could be omitted without departing from the scope or spirit of the invention.

Figure 2C:
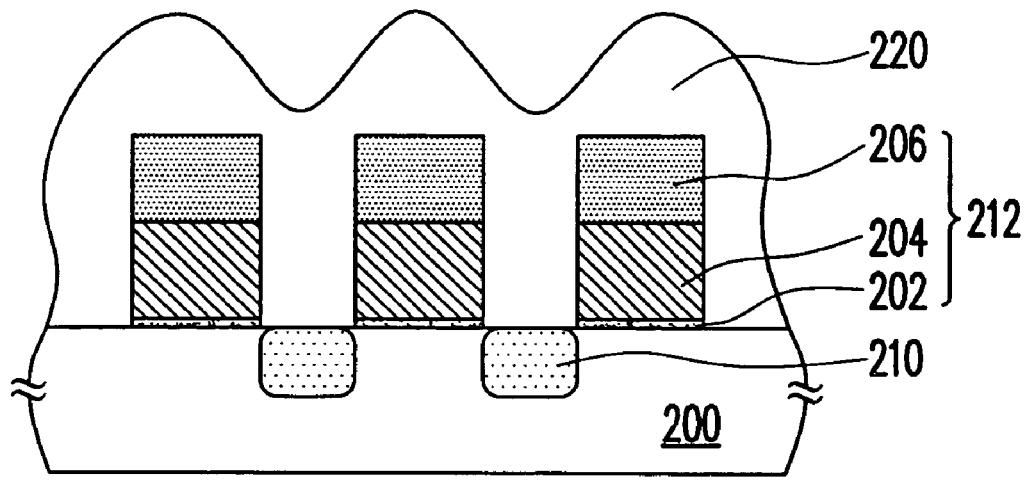

As shown in FIG. 2C, multiple embedded doping regions 210 is formed in the substrate 200 between the stack structures 212. Thereafter, a dielectric layer 220 is formed over the substrate such as formed by performing a high-density plasma chemical vapor deposition (HDPCVD) process to cover the stack gate structures 212. The dielectric layer 220 is a high-density plasma phosphosilicate glass layer, for example. Besides, the method for forming the dielectric layer 220 also includes other suitable method.

Figure 2D:
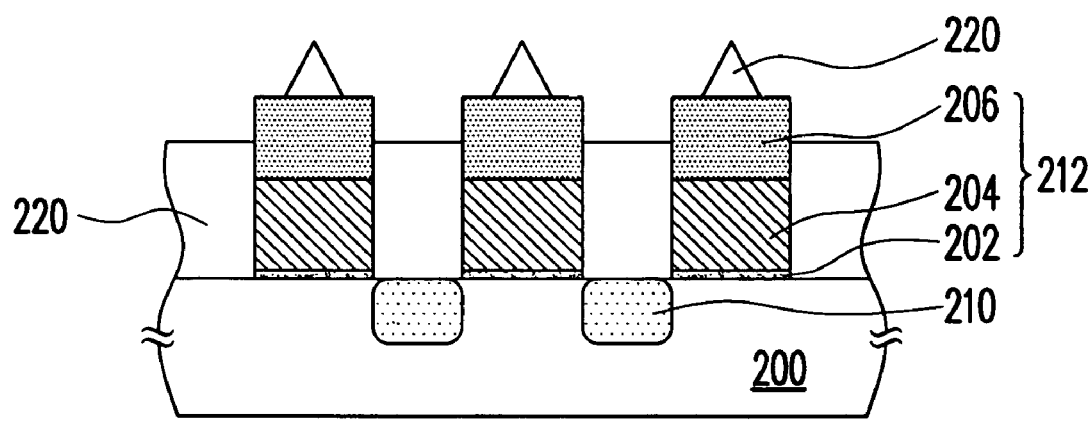

As shown in FIG. 2D, the dielectric layer 220 is etched back to expose the top edges of the material layer 206 of the stack structures 212, for example, and remain a portion of the dielectric layer 220 over the stack structures 212. The method of etching back the dielectric layer 220 includes performing a plasma dry etching process or wet etching process, for example.

Figure 2E:
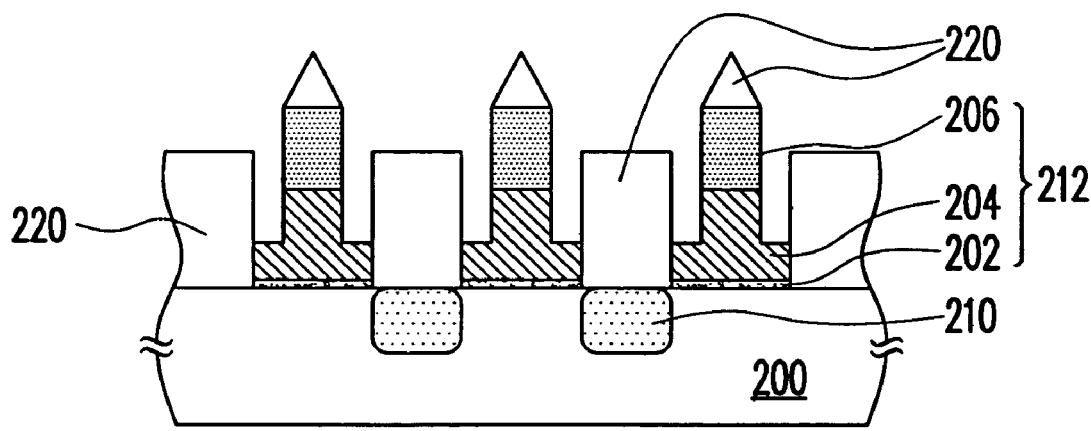

As shown in FIG. 2E, a portion of the material layer 206 and a portion of the first conductive layer 204 are removed by using the remaining dielectric layer 220 as a mask.

Figure 2F:
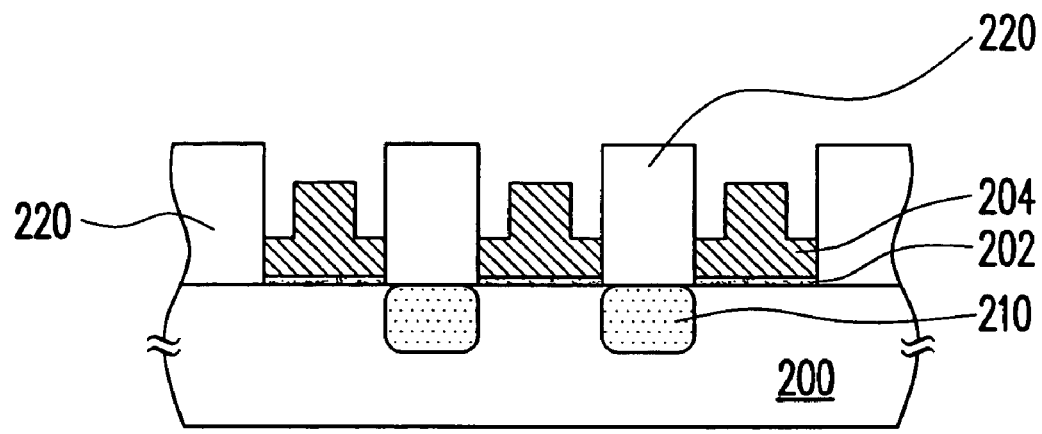

As shown in FIG. 2F, the remaining material layer 206 is removed such that the residual dielectric layer 220 on the material layer 206 is also removed, for example. On the other hand, a lift-off process can be utilized to remove the remaining dielectric layer 220.

Figure 2G:
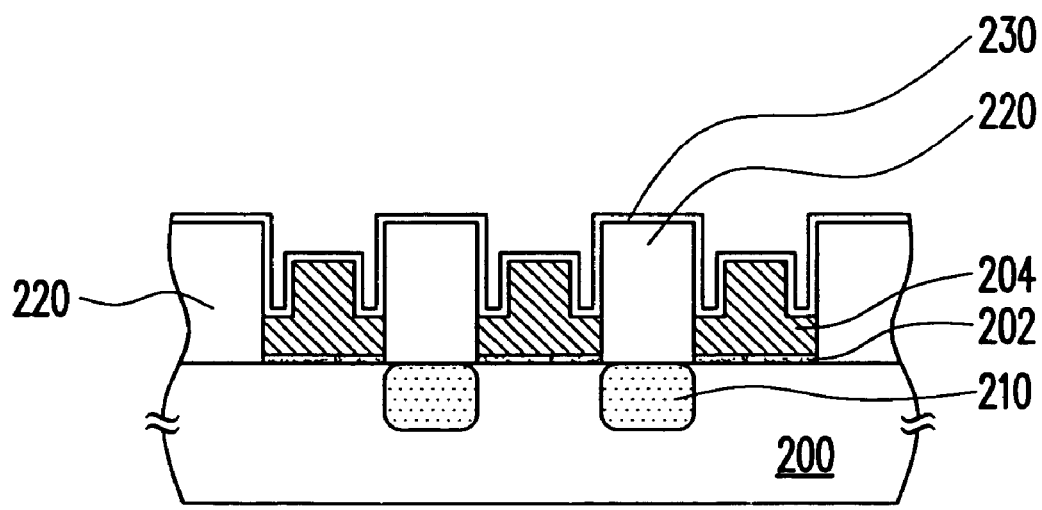

As shown in FIG. 2G, an inter-layer dielectric layer 230 is formed over the first conductive layer 204. The inter-layer dielectric layer 230 is an oxide-nitride-oxide (ONO) layer, for example.

Figure 2H:
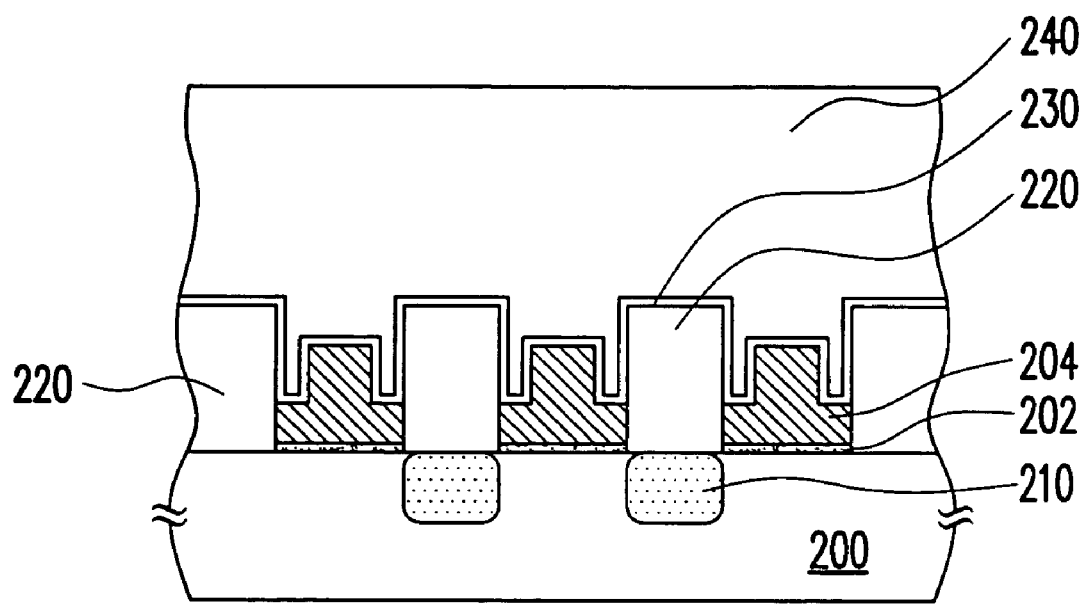

As shown in FIG. 2H, a second conductive layer 240 is formed over the inter-layer dielectric layer 230. The second conductive layer 240 is a doped polysilicon layer, for example.

Figure 3A:
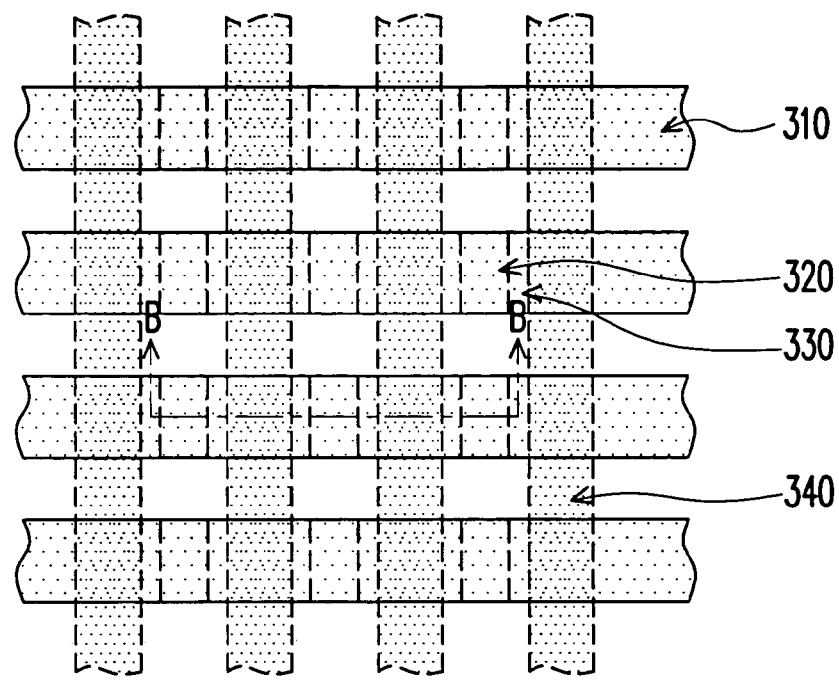
FIG. 3A is a top view of a flash memory device according to a second preferred embodiment of the present invention.
Figure 3B:
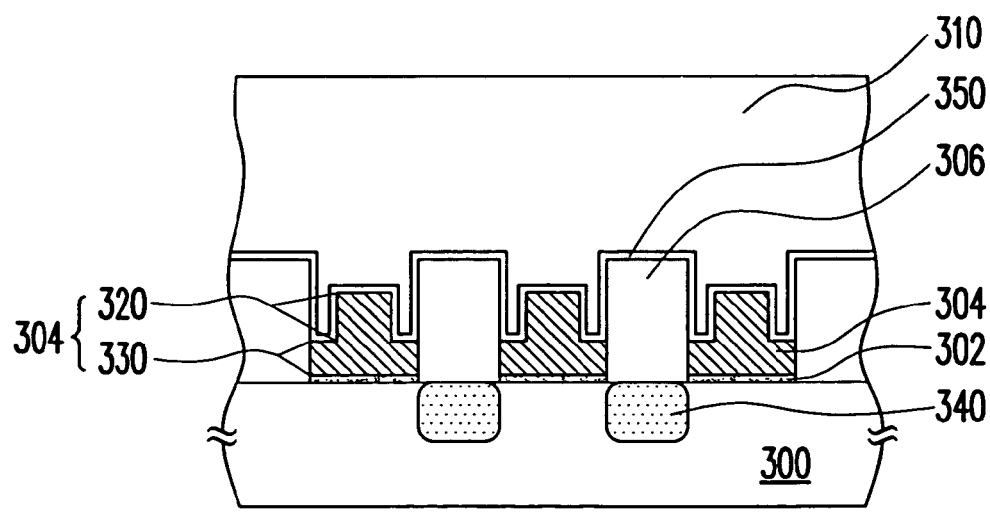
FIG. 3B is a schematic cross-sectional view along line B-B of FIG. 3A.

FIG. 3A is a top view of a flash memory device according to a second preferred embodiment of the present invention. FIG. 3B is a schematic cross-sectional view along line B-B of FIG. 3A. As shown in FIGS. 3A and 3B, the flash memory in the second embodiment comprises a substrate 300, multiple floating gates 304, multiple dielectric layers 306, multiple word lines 310, multiple bit lines 340, an inter-layer dielectric layer 350 and a tunneling oxide layer 302. Each floating gate comprises a top portion 320 and a bottom portion 330. The bottom of the bottom portion 330 occupies an area larger than the top of the top portion 320. The bit lines 340 are disposed in the substrate 300 underneath the dielectric layers 306. The word lines 310 are disposed over the substrate 300 and crosses over the bit lines 340. The floating gates 304 are disposed over the substrate 300 between the bit lines 340. The inter-layer dielectric layers 350 are disposed between the floating gates 304 and the word lines 310. The tunneling dielectric layers 302 are disposed between the substrate 300 and the floating gates 304. The word lines 310 are doped polysilicon layers, the floating gates 304 are doped polysilicon layers, the dielectric layers 306 are high-density plasma phosphosilicate glass layers each having a thickness between about 1500Å to 3000Å, for example. The inter-layer dielectric layer 350 is an oxide-nitride-oxide (ONO) layer, for example.

In summary, the aspects of the present invention includes:

1. A self-aligned process is employed to define the floating gate. Hence, one critical photolithographic processing step is saved.

2. The floating gate structure has a top-narrow/bottom-wide configuration. Hence, the overlapping area between the floating gate and a subsequently formed control gate is increased. Thus, the fabrication process is simplified and the gate-coupling ratio of the stack gate is increased.

3. By forming the top-narrow/bottom-wide floating gate structure in a back etching operation, the overlapping area between the floating gate and a subsequently formed control gate is increased to increase the gate-coupling ratio just like the conventional process. However, the present invention has a greater capacity for device miniaturization.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a flash memory device, comprising the steps of:

forming a plurality of stack structures over a substrate, wherein each stack structure comprises a tunneling oxide layer and a first conductive layer sequentially stacked over the substrate;

forming a plurality of embedded doping regions in the substrate between the stack structures;

forming a dielectric layer over the substrate to cover the stack structures;

etching back the dielectric layer without using an etching mask and remaining a portion of the dielectric layer over the stack structures;

removing a portion of the first conductive layer using the remaining dielectric layer as a mask;

removing the remaining dielectric layer;

forming an inter-layer dielectric layer over the first conductive layer; and forming a second conductive layer over the inter-layer dielectric layer.

2. The method of claim 1, wherein the step of forming the dielectric layer over the substrate comprises performing a high-density plasma chemical vapor deposition (HDPCVD) process.

3. The method of claim 1, wherein the step of forming the stack structures over the substrate further comprises forming a material layer over the first conductive layer, and the etching selectivity ratio of the material layer to the first conductive layer is larger than 1.

4. The method of claim 3, wherein the step of forming the stack structures over the substrate further comprises:

forming a tunneling oxide layer over the substrate globally;

forming a first conductive layer over the tunneling oxide layer globally;

forming a material layer over the first conductive layer globally;

forming a patterned photoresist layer over the material layer; and etching to remove a portion of the material layer, the first conductive layer and the tunneling oxide layer using the patterned photoresist layer as a mask.

5. The method of claim 4, wherein after removing a portion of the material layer, the first conductive layer and the tunneling oxide layer, further comprises removing the patterned photoresist layer.

6. The method of claim 3, wherein the material layer comprises a nitride layer.

7. The method of claim 1, wherein the step of etching back the dielectric layer comprises performing a plasma dry etching process or wet etching process.

8. The method of claim 1, wherein the first conductive layer comprises a doped polysilicon layer.

9. The method of claim 1, wherein the second conductive layer comprises a doped polysilicon layer.

10. The method of claim 1, wherein the dielectric layer comprises a high-density plasma phosphosilicate glass layer.

11. The method of claim 1, wherein the inter-layer dielectric layer comprises an oxide-nitride-oxide layer.

12. A method of manufacturing a flash memory device, comprising the steps of:

forming a plurality of stack structures over a substrate, wherein each stack structure comprises a tunneling oxide layer and a first conductive layer sequentially stacked over the substrate;

forming a plurality of embedded doping regions in the substrate between the stack structures;

forming a dielectric layer over the substrate to cover the stack structures;

etching back the dielectric layer and remaining a portion of the dielectric layer over the stack structures to expose the top edges of first conductive layer of the stack structure;

removing a portion of the first conductive layer using the remaining dielectric layer as a mask;

removing the remaining dielectric layer, forming an inter-layer dielectric layer over the first conductive layer; and forming a second conductive layer over the inter-layer dielectric layer.

13. The method of claim 12, wherein the step of forming the dielectric layer over the substrate comprises performing a high-density plasma chemical vapor deposition (HDPCVD) process.

14. The method of claim 12, wherein the step of forming the stack structures over the substrate further comprises forming a material layer over the first conductive layer, and the etching selectivity ratio of the material layer to the first conductive layer is larger than 1.

15. The method of claim 14, wherein the step of forming the stack structures over the substrate further comprises:

forming a tunneling oxide layer over the substrate globally;

forming a first conductive layer over the tunneling oxide layer globally;

forming a material layer over the first conductive layer globally;

forming a patterned photoresist layer over the material layer; and etching to remove a portion of the material layer, the first conductive layer and the tunneling oxide layer using the patterned photoresist layer as a mask.

16. The method of claim 15, wherein after removing a portion of the material layer, the first conductive layer and the tunneling oxide layer, further comprises removing the patterned photoresist layer.

17. The method of claim 14, wherein the material layer comprises a nitride layer.

18. The method of claim 12, wherein the step of etching back the dielectric layer comprises performing a plasma dry etching process or wet etching process.

19. The method of claim 12, wherein the first conductive layer comprises a doped polysilicon layer.

20. The method of claim 12, wherein the second conductive layer comprises a doped polysilicon layer.

21. The method of claim 12, wherein the dielectric layer comprises a high-density plasma phosphosilicate glass layer.

22. The method of claim 12, wherein the inter-layer dielectric layer comprises an oxide-nitride-oxide layer.

23. A method of manufacturing a flash memory device, comprising the steps of:

forming a plurality of stack structures over a substrate, wherein each stack structure comprises a tunneling oxide layer and a first conductive layer sequentially stacked over the substrate;

forming a plurality of embedded doping regions in the substrate between the stack structures;

forming a dielectric layer over the substrate to cover the stack structures;

etching back the dielectric layer and remaining a portion of the dielectric layer over the stack structures, wherein the etch back does not etch into the substrate;

removing a portion of the first conductive layer using the remaining dielectric layer as a mask;

removing the remaining dielectric layer;

forming an inter-layer dielectric layer over the first conductive layer; and forming a second conductive layer over the inter-layer dielectric layer.

24. The method of claim 23, wherein the step of forming the dielectric layer over the substrate comprises performing a high-density plasma chemical vapor deposition (HDPCVD) process.

25. The method of claim 23, wherein the step of forming the stack structures over the substrate further comprises forming a material layer over the first conductive layer, and the etching selectivity ratio of the material layer to the first conductive layer is larger than 1.

26. The method of claim 25, wherein the step of forming the stack structures over the substrate further comprises:
  forming a tunneling oxide layer over the substrate globally;
  forming a first conductive layer over the tunneling oxide layer globally;
  forming a material layer over the first conductive layer globally;
  forming a patterned photoresist layer over the material layer; and
  etching to remove a portion of the material layer, the first conductive layer and the tunneling oxide layer using the patterned photoresist layer as a mask.

27. The method of claim 26, wherein after removing a portion of the material layer, the first conductive layer and the tunneling oxide layer, further comprises removing the patterned photoresist layer.

28. The method of claim 25, wherein the material layer comprises a nitride layer.

29. The method of claim 23, wherein the step of etching back the dielectric layer comprises performing a plasma dry etching process or wet etching process.

30. The method of claim 23, wherein the first conductive layer comprises a doped polysilicon layer.

31. The method of claim 23, wherein the second conductive layer comprises a doped polysilicon layer.

32. The method of claim 23, wherein the dielectric layer comprises a high-density plasma phosphosilicate glass layer.

33. The method of claim 23, wherein the inter-layer dielectric layer comprises an oxide-nitride-oxide layer.

* * * * *